(12) United States Patent
Braathen et al.

(10) Patent No.: US 11,775,120 B2
(45) Date of Patent: Oct. 3, 2023

(54) COMBINED CAPACITIVE AND PIEZOELECTRIC SENSING IN A HUMAN MACHINE INTERFACE

(71) Applicant: Texas Instruments Incorporated, Dallas, TX (US)

(72) Inventors: Jan Morten Braathen, Redmond, WA (US); Dennis Patrick Lehman, Garland, TX (US); Miroslav Oljaca, Allen, TX (US); Maxwell G Robertson, Dallas, TX (US); Merril Newman, Schaumburg, IL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/506,139

(22) Filed: Oct. 20, 2021

(65) Prior Publication Data

US 2022/0236816 A1 Jul. 28, 2022

Related U.S. Application Data

(60) Provisional application No. 63/142,604, filed on Jan. 28, 2021.

(51) Int. Cl.
*G06F 3/044* (2006.01)
*G06F 3/041* (2006.01)

(52) U.S. Cl.
CPC ............ *G06F 3/044* (2013.01); *G06F 3/0414* (2013.01)

(58) Field of Classification Search
CPC ......... G06F 2203/04106; G06F 3/0414; G06F 3/04144; G06F 3/041662; G06F 3/044; H03K 17/962; H03K 17/964
See application file for complete search history.

(56) References Cited

U.S. PATENT DOCUMENTS

2009/0146533 A1 6/2009 Leskinen et al.
2009/0267902 A1* 10/2009 Nambu ................. G06F 3/0421
345/173

(Continued)

OTHER PUBLICATIONS

Chen et al., "Design and Implementation of Capacitive Proximity Sensor Using Microelectromechanical Systems Technology," Trans. Industrial Elec., vol. 45, No. 6 (IEEE, 1998).

(Continued)

*Primary Examiner* — Hong Zhou
(74) *Attorney, Agent, or Firm* — Mandy Barsilai Fernandez; Frank D. Cimino

(57) ABSTRACT

A human machine interface (HMI) system and method of operating. The system includes capacitive measurement circuitry coupled to one or more capacitive touch elements, and piezoelectric measurement circuit including interface circuitry coupled to one or more piezoelectric touch elements. The capacitive measurement circuitry includes a gain stage configured to amplify a signal corresponding to a capacitance at the one or more capacitor input terminals by a gain level for communication to processing circuitry. Gain control circuitry is configured to increase the gain level of the gain stage of the capacitive measurement circuitry responsive to the piezoelectric measurement circuitry receiving a user input from at least one of the piezoelectric touch elements. Implementations that further include piezoelectric drive circuitry for haptic output and clearing debris from the keypad are also disclosed.

21 Claims, 9 Drawing Sheets

(56) References Cited

U.S. PATENT DOCUMENTS

| | | | |
|---|---|---|---|
| 2011/0043477 A1* | 2/2011 | Park | G06F 3/044 345/173 |
| 2014/0327531 A1 | 11/2014 | Modarres et al. | |
| 2015/0199061 A1* | 7/2015 | Kitada | G06F 3/04182 345/173 |
| 2015/0301647 A1* | 10/2015 | Sato | G06F 3/044 345/174 |
| 2016/0048213 A1* | 2/2016 | Zafiris | G06F 3/017 345/174 |
| 2016/0231851 A1* | 8/2016 | Liu | G06F 3/0416 |
| 2016/0239127 A1* | 8/2016 | Kano | G06F 3/0414 |
| 2018/0059866 A1* | 3/2018 | Drake | G06F 3/04186 |
| 2019/0050080 A1 | 2/2019 | Bagher et al. | |
| 2019/0286263 A1 | 9/2019 | Bagher et al. | |
| 2020/0098967 A1* | 3/2020 | Chaput | H01L 41/1132 |
| 2020/0241682 A1* | 7/2020 | Tokunaga | G01D 5/24 |
| 2021/0050852 A1 | 2/2021 | Pan et al. | |
| 2022/0035420 A1* | 2/2022 | Wang | G06F 1/1647 |
| 2023/0021208 A1* | 1/2023 | Gazes | G06F 3/044 |

OTHER PUBLICATIONS

"DRV2667 Piezo Haptic Driver with Boost, Digital Front End, and Internal Waveform Memory," Datasheet DRV2667 (Texas Instruments Incorporated, 2018).

"MSP430FR267x Capacitive Touch Sensing Mixed-Signal Microcontrollers," Datasheet SLASE05C (Texas Instruments Incorporated, 2020).

"Capacitive Sensing Technology, Products, and Applications," White Paper SLAA945 (Texas Instruments Incorporated, 2020).

Ramkumar, "MSP430 FRAM microcontrollers with CapTIvate technology," White Paper SLAY044 (Texas Instruments Incorporated, 2015).

Schnoor et al., "Enabling noise tolerant capacitive touch HMIs with MSP CapTIvate technology," White Paper SLAY045B (Texas Instruments Incorporated, 2019).

Ramkumar, "Capacitive touch and MSP microcontrollers," White Paper SLAY048A (Texas Instruments Incorporated, 2015).

International Search Report, International Patent Application No. PCT/US2022/012875, dated May 5, 2022, 2 pgs.

* cited by examiner

COMBINED CAPACITIVE AND PIEZOELECTRIC SENSING IN A HUMAN MACHINE INTERFACE

CROSS-REFERENCE TO RELATED APPLICATIONS

This application claims the benefit of and priority to U.S. Provisional Application No. 63/142,604, filed Jan. 28, 2021, which is hereby fully incorporated herein by reference.

BACKGROUND OF THE INVENTION

This relates to input devices for electronic systems, and more particularly to touch-sensitive input devices.

Mechanical buttons for user actuation of switches or other controls for electronic systems have been commonplace for many years. In newer systems, however, capacitive sensing is rapidly becoming a prevalent human-machine interface (HMI) technology. Actuators using capacitive sensing can be realized in thinner and more elegant forms, of various shapes and sizes, as compared with conventional mechanical buttons and switches. As such, a wide range of HMI applications including appliances, point of sale terminals, security systems, environmental controls, security systems, and other industrial and consumer applications now use capacitive touch sensors.

By way of further background, conventional capacitive sensors operate by detecting changes in capacitance due to a user's finger touching or being in close proximity to the button, slider, wheel, or other actuator. One conventional approach for this measurement is referred to as a "self capacitance" measurement, in which the capacitance at a sensing element relative to earth ground is measured. The user input is detected as increase in this capacitance by the addition of a parallel capacitance from a user's finger (at earth ground) touching an insulating overlay at the sensing element. Self capacitance measurements are often used to implement buttons (e.g., elevator buttons). Another approach, referred to as a "mutual capacitance" measurement, is based on a capacitive sensing element having one plate as a transmit electrode and a second plate as a receive electrode, between which a potential is maintained. A user input is detected from disruption of electric field propagation between the transmit and receive electrodes caused by a user's finger (at earth ground) touching an overlay over the electrodes. Mutual capacitance measurements are often used with slider or wheel HMI elements.

By way of further background, mixed-signal microcontroller integrated circuits that include measurement capability for capacitive touch sensing are known in the art. One example of such an integrated circuit is the MSP430FR267x microcontroller available from Texas Instruments Incorporated.

Certain challenges are presented for capacitive HMI devices deployed in certain environments in which the capacitive effect of user inputs may be attenuated. For example, the user of an outdoor keypad entry system, or such a system in a sterile or clean room environment, may be wearing gloves, which will reduce the capacitive effect of a finger press or movement. Similarly, rain, ice, or other environmental conditions at the keypad may insulate the user's finger from the capacitive sensor, also reducing the ability of the HMI device to detect the user input. Increasing the amplification gain of the signal from the capacitive element to compensate for the smaller change in capacitance under these conditions can give rise to other problems such as the detection of spurious or false inputs.

It is within this context that the embodiments described herein arise.

BRIEF SUMMARY OF THE INVENTION

According to one aspect, an apparatus is provided that includes capacitive measurement circuitry, coupled to one or more capacitor input terminals at which capacitive touch elements in a human machine interface (HMI) may be connected, and piezoelectric measurement circuit including interface circuitry coupled to one or more piezoelectric terminals at which piezoelectric touch elements in the HMI may be connected. The capacitive measurement circuitry includes a gain stage configured to amplify a signal corresponding to a capacitance at the one or more capacitor input terminals by a gain level for communication to processing circuitry. The apparatus further includes gain control circuitry coupled to the piezoelectric measurement circuitry and the capacitive measurement circuitry, and that is configured to increase the gain level of the gain stage responsive to the piezoelectric measurement circuitry receiving a user input from at least one of the one or more piezoelectric terminals.

According to another aspect, a method of detecting user inputs at an HMI is provided. According to one or more example embodiments, the method includes setting a gain level in at least one gain stage in capacitive touch measurement circuitry coupled to a plurality of capacitive touch elements of the HMI to a first gain level, and determining whether one or more piezoelectric touch elements of the HMI is detecting user touch pressure. Responsive to none of the one or more piezoelectric touch elements of the HMI detecting user touch pressure, the capacitive touch measurement circuitry generates measurement signals corresponding to capacitance at one or more of the capacitive touch elements of the HMI using the first gain level. Responsive to one or more piezoelectric touch elements of the HMI detecting user touch pressure, the gain level in at least one gain stage in the capacitive touch measurement circuitry is set to a second gain level greater than the first gain level, and the capacitive touch measurement circuitry generates measurement signals using the second gain level.

Technical advantages enabled by one or more of these aspects include a system and method for detecting and sensing of touch inputs at keypads and other HMI input devices deployed outdoors or in other hostile environments, for example in cold environments in which the user may be wearing gloves and in wet environments in which the capacitive sensing of touch inputs is attenuated, even for users using bare fingers. This improved sensing in such environments is enabled without increase vulnerability of the HMI input device to increased noise, thermal drift, and power consumption. The frequency of detecting false inputs, including both false positives and false negatives, can be reduced.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF THE INVENTION

The one or more embodiments described in this specification are implemented into a human machine interface (HMI) device, such as a keypad, as it is contemplated that such implementation is particularly advantageous in that context. However, it is also contemplated that aspects of these embodiments may be beneficially applied in a wide variety of other applications, for example switches, actuators, keyboards, sliders, and other HMI implementations. Accordingly, it is to be understood that the following description is provided by way of example only and is not intended to limit the true scope of this invention as claimed.

Figure 1:
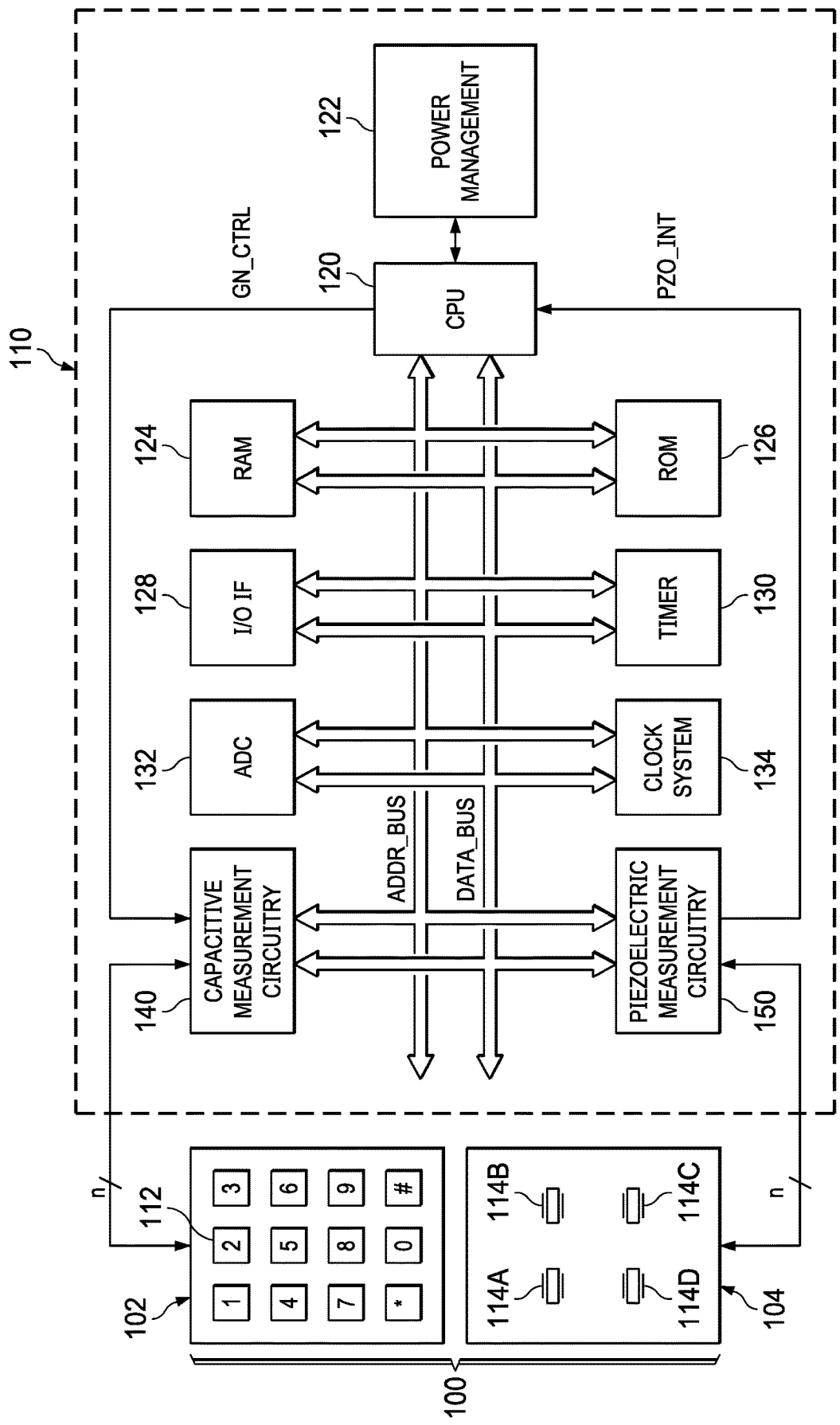
FIG. 1 is an electrical diagram, in block form, of a human machine interface (HMI) system according to example embodiments.

FIG. 1 illustrates the architecture of a touch-sensitive HMI system constructed according to an example embodiment. In this example, keypad 100 includes capacitive array 102, which includes one or more capacitive touch elements 112. In this example, capacitive array 102 includes twelve capacitive touch elements 112, each deployed in keypad 100 at a location corresponding to a button or other HMI actuator. In this example, capacitive touch elements 112 are deployed in the conventional numeric keypad arrangement. Each capacitive touch element 112 may be constructed in the conventional way, for example including two conductive elements or plates in combination with an insulating overlay or other film at which a user's touch may affect the capacitance of the element to provide a user input. Keypad 100 may be constructed to provide visible indicators of the locations of capacitive touch elements 112, enabling the user to make meaningful user inputs to the system. Capacitive touch elements 112 may be implemented in either of the self capacitance or mutual capacitance measurement modes in this example embodiment.

According to this example embodiment, keypad 100 also includes piezoelectric array 104 including one or more piezoelectric touch elements 114. In this example, piezoelectric array 104 includes four piezoelectric touch elements 114A through 114D, each deployed in keypad 100. In this example embodiment, piezoelectric touch elements 114A through 114D may be embedded within keypad 100 and not visible or otherwise associated with a visible indicator for the user. Each piezoelectric element 114 may be constructed of a conventional piezoelectric material such as lead zirconate titanate (PZT) disposed between electrodes and configured to generate a voltage in response to pressure from a user's press of the element 114.

In this example, capacitive array 102 and piezoelectric array 104 are arranged in keypad 100 to overlay one another, or in some other arrangement so that the same user touch at certain locations of keypad 100 is detectable by both a capacitive touch element 112 and a piezoelectric touch element 114. In the example embodiment of FIG. 1, the number of piezoelectric touch elements 114 differs from the number of capacitive touch elements 112, and thus the locations of the two types of touch elements do not necessarily coincide. Alternatively, both a capacitive touch element 112 and a piezoelectric touch element 114 may be deployed at one or more actuator locations of keypad 100; in some implementations, both a capacitive touch element 112 and a piezoelectric touch element 114 may be deployed at each actuator location of keypad 100. As noted above, piezoelectric touch elements 114 may be embedded within keypad 100 so as to not be visible. Alternatively, piezoelectric touch elements 114 may be associated with visible indicators associated separate from those associated with capacitive touch elements 112. Further in the alternative, one or more piezoelectric touch elements 114 may be associated with the same visible indicator as a capacitive touch element 112.

In the system of FIG. 1, capacitive array 102 and piezoelectric array 104 of keypad 100 are coupled to microcontroller 110. Microcontroller 110 in this example embodiment includes a central processing unit (CPU) 120, for example arranged as a reduced instruction set computer (RISC) architecture operating on data in a register file. In this example architecture of microcontroller 110, CPU 120 is coupled to various peripheral functional circuitry modules via address bus ADDR_BUS and data bus DATA BUS. In the example shown in FIG. 1, these functional modules include memory resources such as random access memory 124 and read-only memory 126, one or more input/output interface functions 128, one or more timers 130, analog-to-digital converter (ADC) module 132, and clock system 134. Other functional circuitry modules may alternatively or additionally be implemented in microcontroller 110 as desired for the particular application. Also as shown in FIG. 1, power management function 122 is separately coupled to CPU 120 and is configured for managing power consumption and supply to CPU 120 and the various functional modules. Other support modules such as scan test functionality and the like may also be included. Microcontroller 110 may alternatively be realized with alternative bus architectures and according to other architectural variations from that shown in FIG. 1.

According to this example embodiment, microcontroller 110 includes capacitive measurement circuitry 140 and piezoelectric measurement circuitry 150 as additional functional modules, each coupled to CPU 120 via address bus ADDR_BUS and data bus DATA_BUS. In this example, capacitive measurement circuitry 140 is coupled to capacitive array 102 in keypad 100 and is configured to acquire measurements of capacitance from the one or more capacitive touch elements 112 in capacitive array 102. Similarly, piezoelectric measurement circuitry 150 is coupled to piezoelectric array 104 in keypad 100 and is configured to acquire measurements of pressure from the one or more piezoelectric touch elements 114 in piezoelectric array 104.

In this example embodiment, piezoelectric measurement circuitry 150 is constructed or configured to cause a gain control signal to be forwarded to capacitive measurement circuitry 140 in response to measurements acquired from the one or more piezoelectric touch elements 114 in piezoelectric array 104. For purposes of illustration, microcontroller 110 includes a control line PZO_INT coupled from piezoelectric measurement circuitry 150 to CPU 120 for communicating an interrupt request in response to piezoelectric measurement circuitry 150 detecting a touch event at piezoelectric array 104. Microcontroller 110 also includes a control line GN_CTRL to communicate a gain control signal from CPU 120 to capacitive measurement circuitry 140, in response to the interrupt request from piezoelectric measurement circuitry 150 on line PZO_INT. Alternatively, CPU 120 may receive measurements from piezoelectric measurement circuitry 150 and may communicate gain control signals to capacitive measurement circuitry 140 over buses ADDR_BUS, DATA_BUS. Further in the alternative, piezoelectric measurement circuitry 150 may be configured to communicate the gain control signal directly to capacitive measurement circuitry 140, without involving CPU 120.

Figure 2:
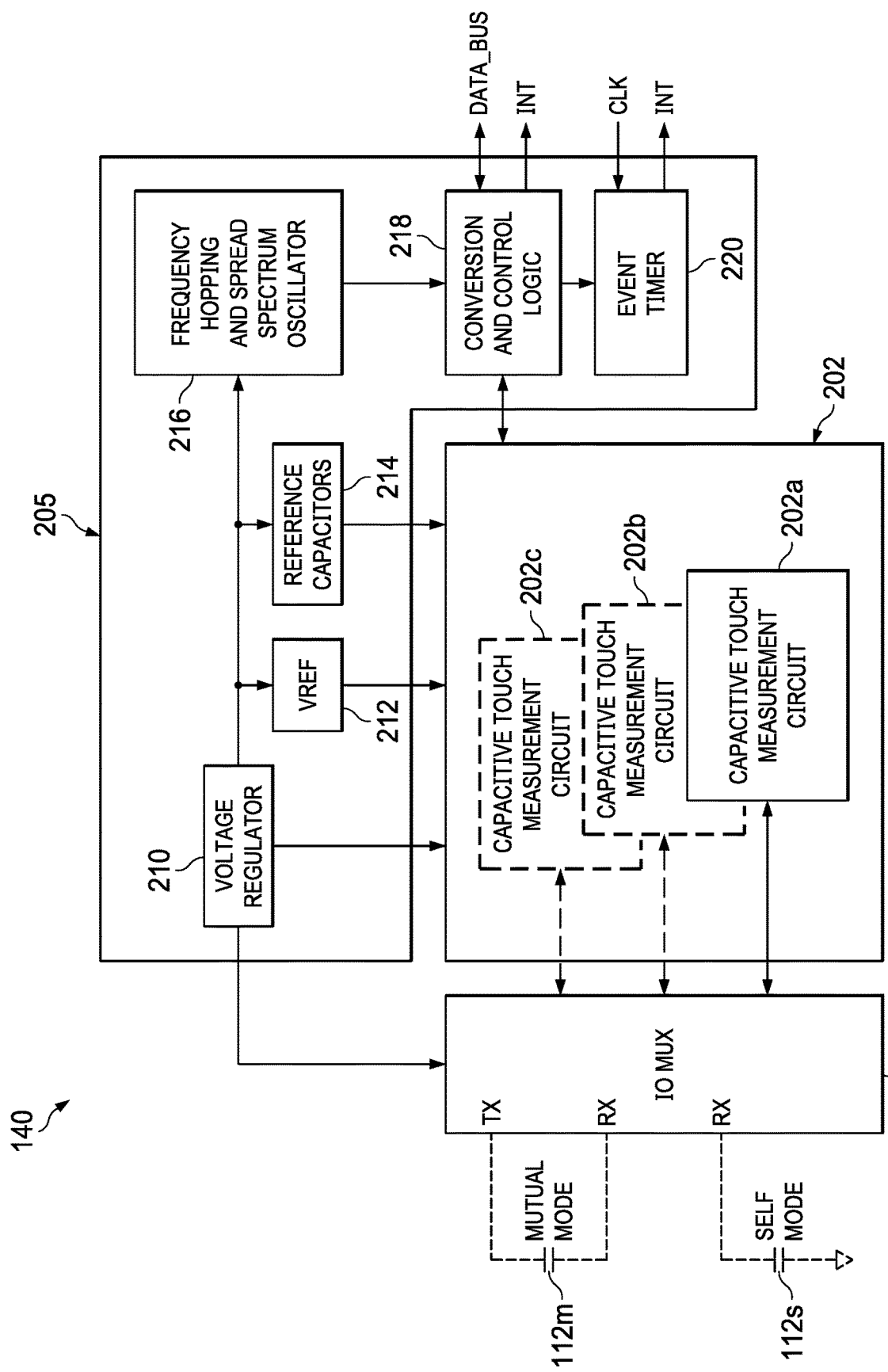
FIG. 2 is an electrical diagram, in block form, of a capacitive measurement function in the system of FIG. 1 according to an example embodiment.

Referring now to FIG. 2, the construction of capacitive measurement circuitry 140 according to an example embodiment will now be described. In this example embodiment, input/output multiplexer 200 in capacitive measurement circuitry 140 is coupled to one or more terminals of microcontroller 100 that is configured to interface with capacitive touch elements 112. Input/output multiplexer 200 in this example embodiment operates to couple the one or more selected capacitive touch elements 112 to a corresponding capacitive touch measurement circuit 202. As suggested in FIG. 2, capacitive measurement circuitry 140 may include multiple capacitive touch measurement circuits 202a, 202b, 202c to enables parallel scanning of multiple capacitive touch elements 112. Each capacitive touch measurement circuit 202 may be configurable to operate in either self capacitance measurement mode or in mutual capacitance measurement mode. As such, as suggested in FIG. 2, terminals coupled to input/output multiplexer 200 may include transmit and receive terminals from which capacitive touch measurement circuit 202 detects inputs from a capacitive touch element 112m coupled in the mutual capacitance mode, and may include receive terminals from which capacitive touch measurement circuit 202 detects inputs from a capacitive touch element 112s coupled in the self capacitance mode.

The measurements made by each capacitive touch measurement circuit 202 in the example of FIG. 2 are controlled by various support circuitry 205 in capacitive measurement circuitry 140. As shown in FIG. 2, this support circuitry 205 for making the relevant measurements include low drop-out (LDO) voltage regulator 210, reference voltage generator circuitry 212, and reference capacitors 214. In this example embodiment, support circuitry 205 includes frequency hopping and spread spectrum oscillator circuitry 216 to enable performing the capacitance measurements at various frequencies, so that capacitance measurements at frequencies corrupted by common-mode noise may be rejected. Control and reporting of results of the capacitance measurements made by capacitive touch measurement circuits 202a through 202c is managed by conversion and control logic 218, which interfaces with data bus DATA_BUS and, in this example, is capable of communicating interrupt requests to CPU 120 on separate control line INT in response to the capacitance measurements or other events. Capacitive measurement circuitry 140 in this example also includes event timer 220 and other timer circuitry, operating based on a clock signal received on line CLK and generating interrupt requests on line INT as appropriate.

Figure 3:
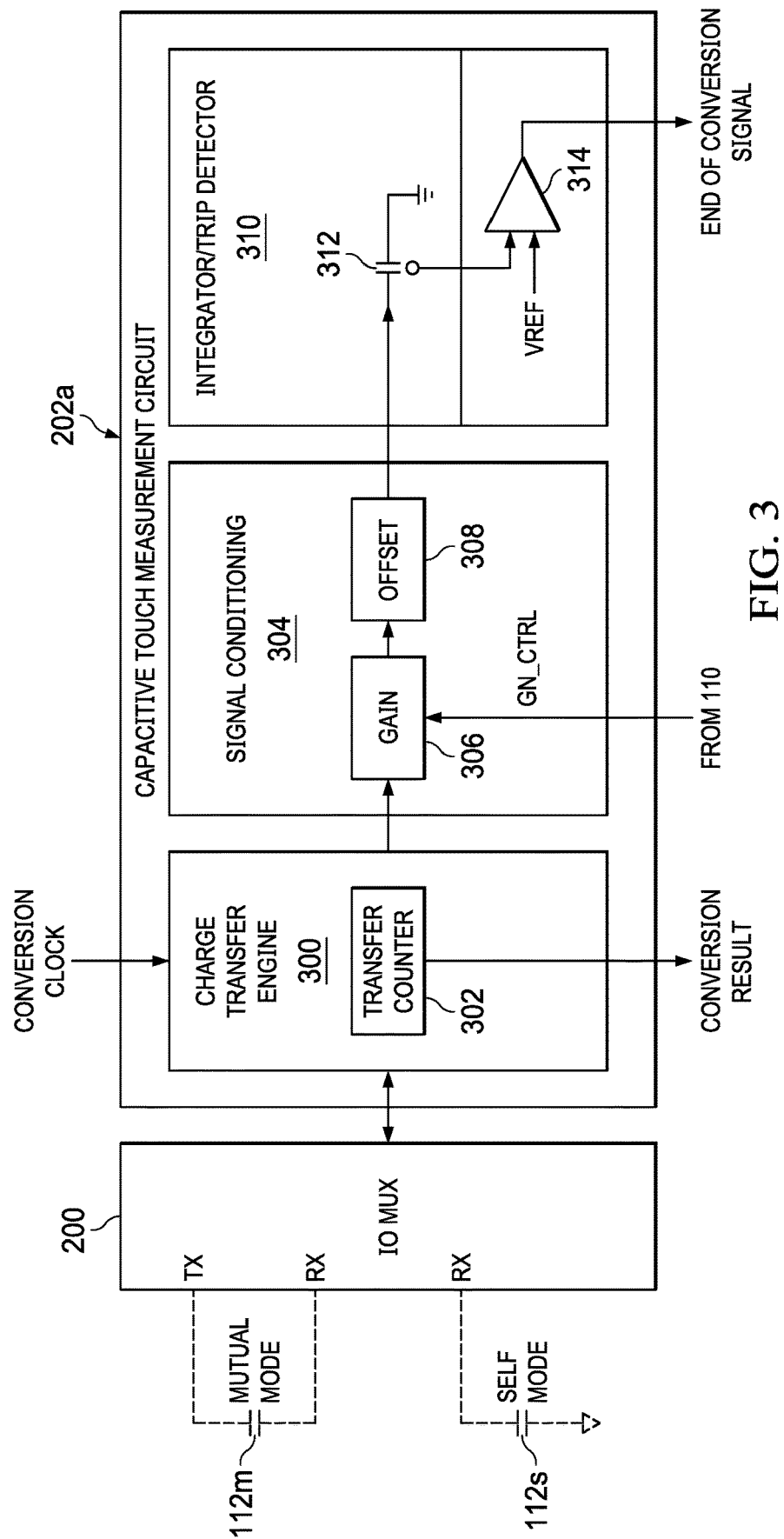
FIG. 3 is an electrical diagram, in block form, of a capacitive touch measurement block in the function of FIG. 2 according to an example embodiment.

FIG. 3 illustrates the construction of capacitive touch measurement circuit 202a in capacitive measurement circuitry 140 according to an example embodiment in which the capacitive measurement is made using a charge transfer measurement technique. An example of a charge transfer measurement technique as may be applied by capacitive touch measurement circuit 202a according to this example embodiment is described in U.S. Patent Application Publication No. US2021/0050852 A1, commonly assigned herewith and incorporated herein by this reference. As shown in FIG. 3, input/output multiplexer 200 couples a capacitive touch element 112 at its terminals, configured in the self capacitance or mutual capacitance mode, to charge transfer engine 300 in capacitive touch measurement circuit 202a. According to the charge transfer measurement technique applied in this example, charge transfer engine 300 is configured to measure the capacitance at the capacitive touch element 112 by alternately charging capacitive touch element 112 to a selected voltage and transferring the charge from capacitive touch element 112 to capacitor 312 in integrator/trip detector 310 (via signal conditioning circuitry 304 in this example). Integrator/trip detector 310 also includes comparator 314, which compares the voltage at capacitor 312 with a reference voltage VREF. In this example, the charge/transfer cycles applied to capacitive touch element 112 by charge transfer engine are clocked by a conversion clock from frequency hopping and spread spectrum oscillator circuitry 216 of FIG. 2. In this example, the conversion clock frequency is varied by frequency hopping and spread spectrum oscillator circuitry 216 so that measurements may be obtained at multiple frequencies, enabling measurements made at noisy frequencies to be omitted from the capacitance measurement.

As noted above, capacitive touch measurement circuit 202 in this implementation includes signal conditioning function 304. In this example, signal conditioning function 304 includes gain stage 306 for amplifying the charge transferred from capacitive touch element 112 by charge transfer engine 300, and may also include offset compensation 308 to compensate for offset. According to this example implementation, the gain applied by gain stage 306 is at least in part determined by a gain control signal communicated on line GN_CTRL from CPU 120 in response to measurements acquired by piezoelectric measurement circuitry 150 from piezoelectric array 104. Other signal conditioning including filtering may also be applied in signal conditioning function 304.

According to the charge transfer measurement technique, transfer counter 302 counts the number of charge/transfer cycles performed until comparator 314 detects that the voltage at capacitor 312 reaches reference voltage VREF, in response to which comparator 314 issues an end of conversion signal, for example as an interrupt request to CPU 120. In response to the end of conversion, CPU 120 can then interrogate transfer counter 302 to obtain the number of charge/discharge cycles counted as the conversion result, which CPU 120 can process to determine whether a touch event has occurred. For example, CPU 120 may compare the conversion result (e.g., as obtained at the less noisy conversion clock frequencies) relative to a long term average corresponding to a filtered version of conversion counts previously obtained from that capacitive touch element 112. For example, a difference in the measured capacitance at a capacitive touch element 112, as determined from the conversion result, as compared to the long term average indicates a change in capacitance that may be due to a user touch at that element 112. Accordingly, in response to the obtained conversion result exceeding a touch threshold value (e.g., a count corresponding to a proportional offset from the long term average), CPU 120 can identify a touch event at capacitive touch element 112 and process the input accordingly.

According to this example embodiment using a charge transfer measurement technique, the gain applied by gain stage 306 to the transferred charge signal determines the sensitivity of the capacitance measurement, in that a higher gain enables smaller differences in capacitance (e.g., as may occur from a touch of capacitive touch element 112 by a user wearing gloves) to be reliably detected as a touch event. In alternative implementations, it is contemplated capacitive measurement circuitry 140 may be implemented so as to measure capacitance at capacitive touch elements 112 (including changes in capacitance) according to other approaches for generating a measurement signal that may be amplified by a selected gain that at least in part determines the sensitivity of the measurement. It is contemplated that the aspects described in this specification may similarly be applied in such alternative implementations.

Figure 4:
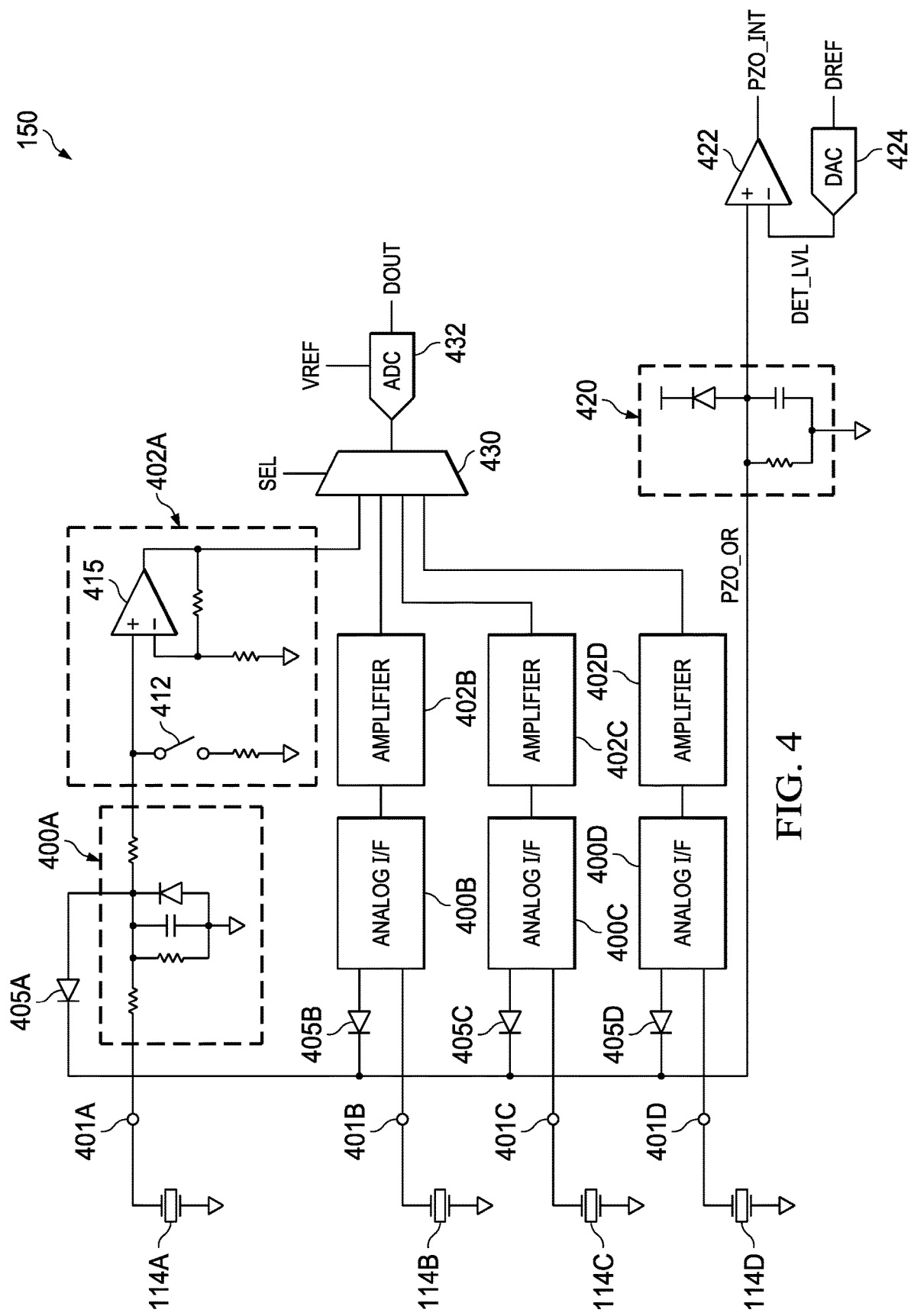
FIG. 4 is an electrical diagram, in block and schematic form, of a piezoelectric measurement function in the system of FIG. 1 according to an example embodiment.

FIG. 4 illustrates the architecture and construction of piezoelectric measurement circuitry 150 according to an example embodiment. In this example and as shown in FIG. 1, piezoelectric measurement circuitry 150 includes an instance of receiver circuitry coupled to each of four external terminals 401A through 401D of microcontroller 110, each of which one of piezoelectric touch elements 114A through 114D is respectively coupled. In this example, referring to piezoelectric touch element 114A, this receiver circuitry includes analog interface 400A and amplifier circuitry 402A. Analog interface 400A is coupled to terminal 401A and includes the appropriate circuit components to forward voltage signals from piezoelectric touch element 114A via diode 405A and to an input of amplifier circuitry 402A. For example, analog interface 400A may include a resistor and capacitor network as shown in FIG. 4 to level-shift the input signal and apply a low-pass filter characteristic. Diode 405A has its anode coupled to an output node of analog interface 400A, and its cathode coupled to a wired-OR node PZO_OR.

In this example embodiment, amplifier circuitry 402A has an input coupled to receive the signal from piezoelectric touch element 114A after conditioning by analog interface 400A. Amplifier circuitry 402A may be constructed in any one of a number of configurations. FIG. 4 illustrates one example of such construction as including operational amplifier 415 with its positive input coupled to an output node of analog interface 400A, and its negative input receiving feedback from its output via a voltage divider arrangement in the conventional manner. Amplifier circuitry 402A in this example also includes switch 412 coupled in series with resistor 413 between the positive input of amplifier 415 and ground. Switch 412 may be controlled by a signal (not shown) from CPU 120 or other control circuitry to reset the voltage at the input of amplifier 415 between measurement instances. As noted above, amplifier circuitry 402A may be constructed and configured in other arrangements as desired for a particular application. In this example embodiment, the output of amplifier 415 is coupled to one input of multiplexer 430.

Piezoelectric measurement circuitry 150 includes similarly constructed analog interfaces 400B, 400C, 400C and amplifier circuitry 402B, 402C, 402D coupled to terminals 401B, 410C, 401D, respectively. In similar fashion as amplifier circuitry 402A described above, the output of each instance of amplifier circuitry 402B, 402C, 402D is coupled to a corresponding input of multiplexer 430.

According to this example embodiment and similarly as described above relative to analog interface 400A, each of analog interfaces 400B, 400C, 400C has an output node coupled to an anode of a corresponding diode 405B, 405C, 405D. The cathodes of diodes 405A, 405B, 405C, 405D are all coupled together at wired-OR node PZO_OR, which is coupled via bias network 420 to a positive input of comparator 422. Comparator 422 has a negative, or reference, input coupled to an output of digital-to-analog converter (DAC) 424 via line DET_LVL. Comparator 422 and DAC 424 may be realized as a functional module in microcontroller 110, residing on address bus ADDR_BUS or data bus DATA_BUS as shown in FIG. 1, or alternatively may be deployed within piezoelectric measurement circuitry 150 itself. In any event, DAC 424 has an input coupled to receive a digital signal indicating a reference level on digital lines DREF, for example from CPU 120 over data bus DATA_BUS. DAC 424 operates to convert this digital reference level DREF into an analog level communicated to the negative input of comparator 422 on line DET_LVL. The output of comparator 422 presents a logic signal on line PZO_INT as an interrupt request to CPU 120 in response to a comparison of the signal at wired-OR node PZO_OR to the analog level on line DET_LVL.

According to this example embodiment, comparator 422 asserts an interrupt request on line PZO_INT in response to a user touch at one or more of piezoelectric elements 114A through 114D. For example, a user touch at piezoelectric element 414A causes a voltage at the corresponding terminal 401A that is coupled via analog interface 400A to the anode of diode 405A. If the user touch is of sufficient pressure to produce a voltage that forward biases diode 405A, that voltage will appear at wired-OR node PZO_OR (less a diode voltage drop). Similarly, user touches at any one or more of piezoelectric elements 414B through 414D will also source current into wired-OR node PZO_OR, while diodes 405B through 405D for those piezoelectric elements 414B through 414D not experiencing a touch will remain reverse-biased. Upon the voltage at wired-OR node PZO_OR resulting from a touch input exceeding the reference level from DAC 424 on line DET_LVL, comparator 422 asserts (e.g., drives a logic "1" level) at its output, which is communicated to CPU 120 as an interrupt request indicating from a user touch somewhere at piezoelectric array 104 of keypad 100.

As will be described in further detail below in connection with one or more example embodiments, CPU 120 responds to the piezoelectric interrupt request generated by piezoelectric measurement circuitry 150 to increase the gain applied by gain stage 306 in one or more capacitive touch measurement circuits 202, and thus increase the sensitivity of microcontroller 110 to capacitive touch user inputs.

As mentioned above in connection with FIG. 4, multiplexer 430 has inputs coupled to the outputs of amplifier circuits 402A, 402B, 402C, 402D. Multiplexer 430 also has a select input coupled to receive a select signal on line SEL, for example from CPU 120, to select one of its inputs for forwarding to an input of ADC 432. ADC 432 in FIG. 4 may correspond to ADC module 132 shown in FIG. 1 as residing on address bus ADDR_BUS and data bus DATA_BUS, or alternatively may be realized within piezoelectric measurement circuitry 150 itself. ADC 432 receives a reference voltage on line VREF, for example from a reference voltage generator elsewhere in microcontroller 110 and converts the analog voltage at its input to a digital signal DOUT for presentation to CPU 120, for example via data bus DATA_BUS.

In operation, multiplexer 430 and ADC 432 of piezoelectric measurement circuitry 150 can operate to interrogate the receiver circuitry associated with each of its terminals 401A through 401C to determine which one or more of piezoelectric elements 114A through 114D is receiving a touch input, and a measure of the pressure of that touch input. For example, this interrogation of individual piezoelectric elements may be performed in response to comparator 422 indicating the presence of a touch input somewhere at piezoelectric array 104. In this case, multiplexer 430 may individually forward the output from each amplifier circuit 402A through 402D to ADC 432 for determining which one is presenting the highest amplitude output, and thus determine which piezoelectric touch element 114 received the input. In addition, to reduce the power consumption of piezoelectric measurement circuitry 150, amplifier circuitry 402A through 402D may be disabled until such time as comparator 422 indicates that a touch input was received at one or more of piezoelectric elements 114A through 114D; in response to this indication, amplifier circuitry 402A through 402D may then be powered up, for interrogation via multiplexer 430 and ADC 432 as described above.

In some implementations in which it is not required to identify which individual piezoelectric element 114A through 114D is receiving a touch input, piezoelectric measurement circuitry 150 may omit amplifier circuitry 402A through 402D, multiplexer 430, and ADC 432 altogether. In the alternative, comparator 422 would remain to indicate the presence of a touch input somewhere at piezoelectric array 104, by issuing the interrupt request on line PZO_INT as noted above.

Figure 5B:
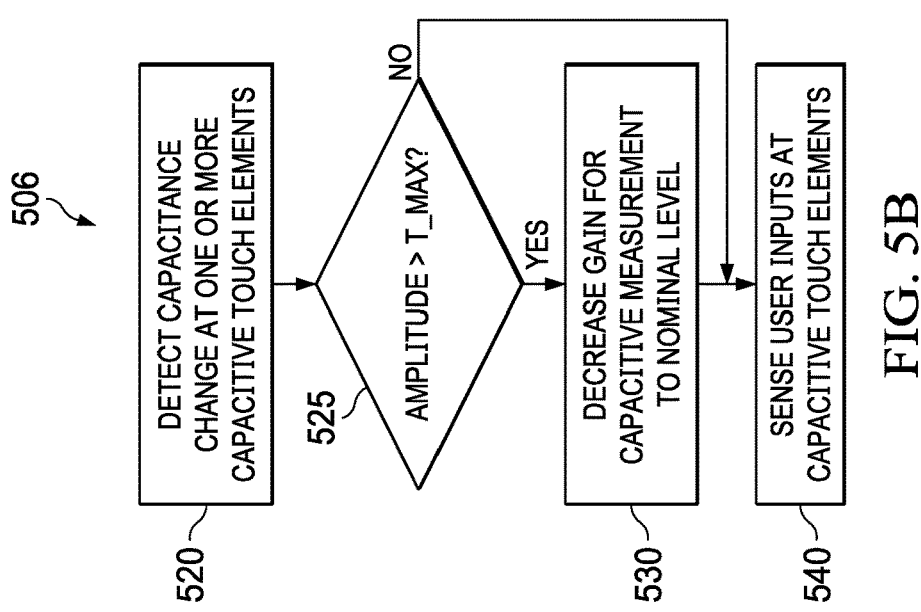
FIG. 5B is a flow diagram of a process of detecting changes in capacitance in the method of FIG. 5A according to an example embodiment.
Figure 5A:
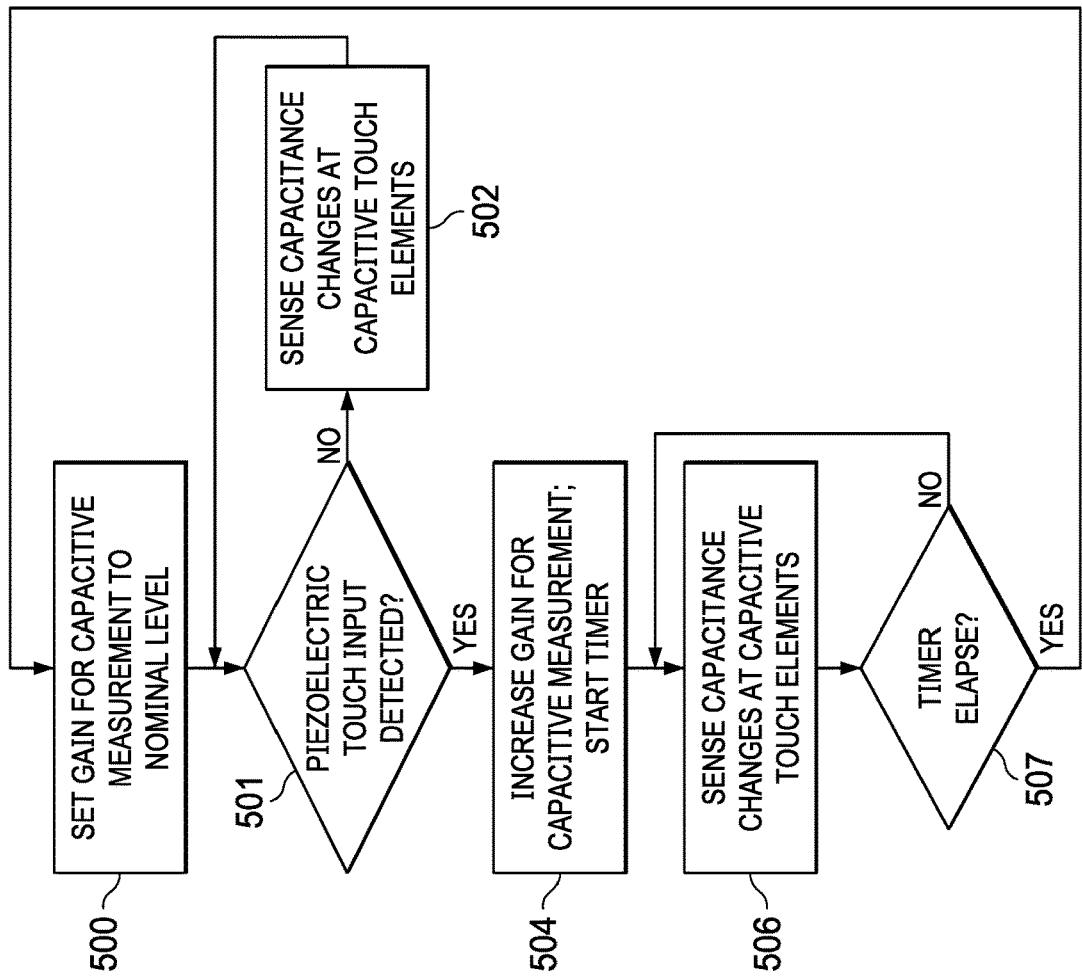
FIG. 5A is a flow diagram of a method of detecting touch inputs in an HMI system as in FIG. 1 according to an example embodiment.

FIG. 5A and FIG. 5B illustrate the generalized operation of the system of FIG. 1, including the response of microcontroller 110 to touch inputs received at keypad 100 according to one or more example embodiments. In this example, it is contemplated that these operations will be carried out by and under the direction and control of CPU 120 in combination with other functions in microcontroller 110. For example, CPU 120 may carry out and control these operations by executing program instructions stored in machine-readable form in the memory resources of the system, such as ROM 126 and in some implementations RAM 124. Alternatively or in addition, some or all of the operations described herein may be executed by special-purpose or dedicated logic circuitry.

As shown in FIG. 5A, operation of the system begins with process 500 in which the gain applied by gain stages 306 of capacitive measurement circuitry 140 capacitance signals as sensed at capacitive touch elements 112 in keypad 100 is set to a nominal level. In this example embodiment, this nominal level corresponds to a relatively low gain level suitable for detection of changes in capacitance at capacitive touch elements 112 in response to a normal touch input by the bare finger of a user in good environmental conditions (e.g., dry conditions). Various inaccuracies and other problems in the touch input system can occur if the gain applied by gain stages 306 is too high, including vulnerability to "false positives" due to noise in capacitive measurement circuitry 140, vulnerability to thermal drift, and higher than optimal power consumption, especially in battery-powered systems. The setting of a low nominal gain in process 500 avoids these issues for those situations in which the low gain adequately detects user touch inputs at keypad 100.

Decision 501 determines whether piezoelectric measurement circuitry 150 has detected the presence of a touch input at one or more piezoelectric touch elements 114A through 114D in this example. As described above relative to FIG. 4, this determination may be made by comparator 422 comparing the voltage at wired-OR node PZO_OR with a reference level on line DET_LVL from DAC 424. In this example, if a touch input of sufficient pressure is present at one or more of piezoelectric elements 114A through 114D, the resulting voltage generated by that piezoelectric element will forward-bias the corresponding diode 405A through 405D and appear at wired-OR node PZO_OR at a voltage exceeding reference level DET_LVL. In response, comparator 422 issues an interrupt request in the form of a logic "1" level at its output, which is communicated on line PZO_INT to CPU 120 in this example implementation. Decision 501 thus returns a "yes" result.

If a touch input of sufficient pressure is not present at keypad 100, the signal level at wired-OR node PZO_OR does not cause comparator 422 to assert the interrupt request. In this case (decision 501 is "no"), microcontroller 110 continues to sense capacitance at capacitive touch elements 112 of keypad 100, amplifying the corresponding measurement signals using the nominal gain value set in process 500 for communication to CPU 120 over data bus DATA_BUS to indicate which capacitive touch elements 112 of keypad 100 received the user input. Operation in this manner continues until detection of a touch input of sufficient force by piezoelectric measurement circuitry 150.

If a piezoelectric touch input is detected (decision 501 is "yes"), CPU 120 receives the interrupt request issued by piezoelectric measurement circuitry 150 on line PZO_INT. CPU 120 processes this requested interrupt in process 504 by increasing the gain applied by gain stages 306 in capacitive measurement circuitry 140 to a selected increased level. For example, as suggested in FIG. 1, CPU 120 may issue a signal to capacitive measurement circuitry 140 (e.g., to gain stages 306) on control line GN_CTRL; alternatively, CPU 120 may issue the gain increase signal over data bus DATA_BUS. Further in the alternative, piezoelectric measurement circuitry 150 may itself issue the gain control signal directly to capacitive measurement circuitry 140. In any case, this increased gain level applied in process 504 increases the sensitivity of the touch input detection at capacitive touch elements 112, for example to be sensitive enough to reliably detect a touch input by a gloved finger, or to detect a touch input by a bare finger in wet (e.g., rainy) conditions or through ice overlaying keypad 100, etc. The capacitive measurement signals are thus amplified using the increased gain value set in process 504 for communication to CPU 120, from which CPU 120 can determine which capacitive touch elements 112 received the user input.

According to this example embodiment, the sensing of changes in capacitance at capacitive touch elements 112 is to be performed using the increased gain level for at most a particular duration, after which the gain applied by gain stages 306 returns to its nominal or other lower gain level. As such, also in process 504, CPU 120 starts a timer operation, for example as may be monitored by timer 130 in microcontroller 110.

Once the gain level is increased in process 504, capacitive measurement circuitry 150 then operates to sense capacitance at one or more of capacitive touch elements 112 of keypad 100 in process 506. In this example embodiment, capacitive measurement circuitry 150 may repeatedly scan capacitive touch measurement blocks 202 to interrogate each capacitive touch element 112 (e.g., each numeric key in keypad 100). Inputs based on the user touch inputs at keypad 100 are then detected by capacitive measurement circuitry 150 using this increased gain level and forwarded to CPU 120 for decoding and other processing to carry out the desired operations of microcontroller 110 in response.

It is conceivable that a user may make a touch input with a bare finger, in good environmental conditions, that is sufficient to not only provide an adequate input for detection and measurement by capacitive measurement circuitry 140 using nominal gain, but that is also of sufficient pressure to be detected by piezoelectric measurement circuitry 150 (decision 501 is "yes"), causing the gain applied by capacitive measurement circuitry 140 to be increased in process 504. But for bare finger inputs in good conditions, this increased gain level may be too high for accurate operation and can cause excessive power consumption. FIG. 5B illustrates an optional method of executing process 506 to adjust the gain of capacitive measurement circuitry 140 for this situation.

In this alternative approach, process 506 is performed by capacitive measurement circuitry 140 first detecting and measuring capacitance at one or more capacitive touch elements 112 in process 520. For this first pass through process 520, the gain applied by gain stages 306 is the increased gain applied in process 504. The measured capacitance signals are forwarded by capacitive measurement circuitry 140 to CPU 120 for its comparison with a maximum threshold level T_MAX in decision 525. For example, this maximum threshold level T_MAX may be selected to detect an amplitude of capacitance change corresponding to a bare finger at a capacitive touch element 112 under ideal conditions. If CPU 120 determines that the amplitude of the capacitance change detected in process 520 is below this maximum threshold level T_MAX (decision 525 is "no"), for example as in the case of a touch input at keypad 100 by a gloved finger or a bare finger in wet or icy conditions, the increased gain level will be maintained and process 540 will be performed at this increased gain level to acquire the user inputs from keypad 100 for processing and response by CPU 120. If, however, the amplitude of the capacitance change detected in process 520 is above this maximum threshold level T_MAX (decision 525 is "yes"), for example as in the case of a touch input at keypad 100 by a bare finger in dry conditions, the gain level applied by gain stages 306 will be reduced to a lower gain level in process 530, for example reduced to the nominal level originally set in process 500. Process 540 will then be performed at this nominal gain level to acquire the user inputs from keypad 100 for processing and response by CPU 120.

As noted above in connection with process 504, the increased gain at gain stages 306 is to be applied by gain stages 306 to the capacitance measurements from keypad 100 for a certain duration, after which the gain is to return to the nominal or other lower level. It is contemplated that this duration may be preselected and stored in a register or other memory location in advance, for example as a fixed value set at manufacture or as a user-programmable value. For example, this duration may be set to a value of a few seconds to allow sufficient time for a user touch input at keypad 100. Referring back to FIG. 5A, while sensing capacitance at capacitive touch elements 112 in process 506 using the increased gain level applied in process 504, microcontroller 110 periodically interrogates the timer (e.g., timer 130) set in process 504 to determine whether this duration has elapsed. If the duration of increased gain has not yet elapsed (decision 507 is "no"), capacitance at capacitive touch elements 112 in keypad 100 will continue to be measured by capacitive touch measurement blocks 202 using the increased gain level set in process 504.

If the duration of increased gain has elapsed (decision 507 is "yes"), microcontroller 110 resets the gain applied by gain stages 306 in capacitive touch measurement blocks 202 to its nominal or other lower value. Sensing of touch inputs at keypad 100 then continues from process 500 as described above.

The combination of piezoelectric and capacitive touch input detection in the system and methods described above in this and other example embodiments, provides important technical advantages in the operation of HMI systems utilizing touch inputs. In a general sense, these example embodiments provide a system and method for detecting and sensing of touch inputs at keypads and other HMI input devices deployed outdoors or in other hostile environments, for example in cold environments in which the user may be wearing gloves and in wet environments in which the capacitive sensing of touch inputs is attenuated, even for users using bare fingers. Increased sensitivity of capacitive touch inputs is efficiently provided, according to these example embodiments, by invoking the increased gain in response to significant touch pressure as sensed at piezoelectric touch elements, as well as by limiting the duration of the increased gain. Vulnerability to increased noise, thermal drift, and power consumption as would otherwise result from unconditionally increasing the gain for capacitive touch measurement are avoided and limited. The frequency of detecting false inputs, including both false positives and false negatives, can be reduced accordingly.

Figure 6:
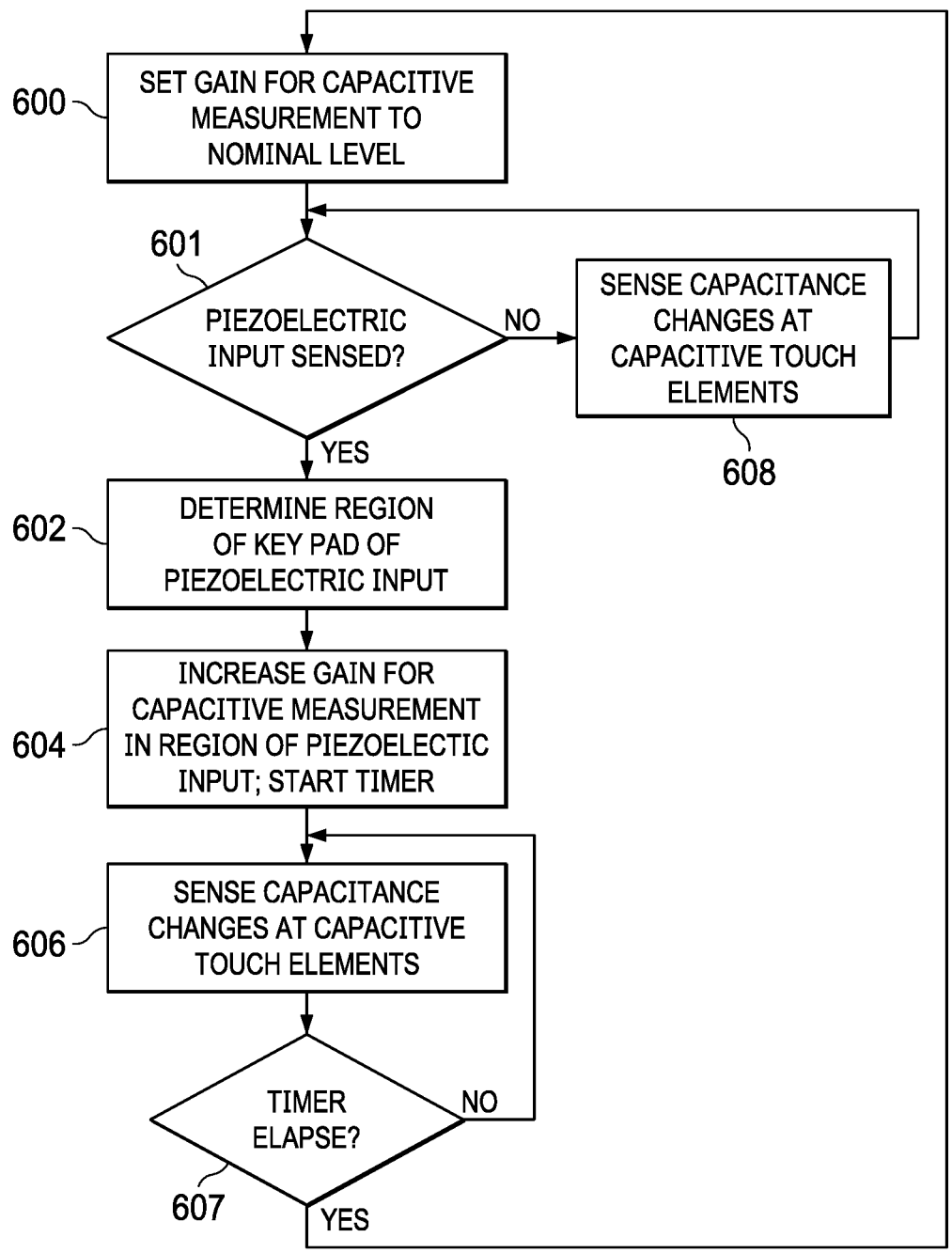
FIG. 6 is a flow diagram of a method of detecting touch inputs in an HMI system as in FIG. 1 according to an alternative example embodiment.

FIG. 6 illustrates the operation of the system of FIG. 1 according to another example embodiment in which keypad 100 includes more than one piezoelectric touch element 114, for example four such piezoelectric touch elements 114A through 114D physically deployed at quadrants of keypad 100 as suggested in FIG. 1. As will now be described, the multiple piezoelectric touch elements 114 are used to advantage to adjust the sensitivity of the system more precisely to user touch inputs.

In the example embodiment of FIG. 6, the operation of the system begins with process 600 in which the gain applied by gain stages 306 of capacitive measurement circuitry 140 is set to a nominal level. In decision 601, microcontroller 110 determines whether piezoelectric measurement circuitry 150 has detected the presence of a touch input at one or more piezoelectric touch elements 114A through 114D, for example by comparator 422 comparing the voltage at wired-OR node PZO_OR with a reference level on line DET_LVL from DAC 424 as described above. If not (decision 601 is "no"), microcontroller 110 continues to sense capacitance changes at capacitive touch elements 112 of keypad 100 using the nominal gain value set in process 600.

According to this example embodiment, if a touch input of sufficient pressure is present at one or more of piezoelectric elements 114A through 114D (decision 601 is "yes"), comparator 422 will issue an interrupt request in the form of a logic "1" level at its output, which is communicated on line PZO_INT to CPU 120 in this example implementation. In this example, CPU 120 will handle this interrupt resulting from detection of a piezoelectric input by determining which of piezoelectric touch elements 114A through 114D received the detected touch input. Referring to FIG. 4, process 602 may be executed by CPU 120 issuing select control signals on line SEL to multiplexer 430 in piezoelectric measurement circuitry 150 to select each of amplifiers 402A through 402D in turn. As described above, the one of amplifiers 402A through 402D selected by multiplexer 430 will apply its output to ADC 432 for conversion of the analog amplifier output signal to a digital value on lines DOUT. The digital values on lines DOUT are communicated to CPU 120, for example as a sequence of values communicated over data bus DATA_BUS. In process 602, CPU 120 determines, from this sequence of digital values, which of the amplifiers 402A through 402D produced the highest amplitude signal, and thus which one of the piezoelectric touch elements 114A through 114D was nearest to the user's touch input. This determines the region of keypad 100 that was touched by the user. For the example of piezoelectric touch elements 114A through 114D physically deployed in quadrants of keypad 100, this determination of process 602 identifies which quadrant of keypad 100 was pressed by the user.

After identification of the touched region of keypad 100 in this example embodiment, CPU 120 operates in process 604 to increase the gain applied by gain stages 306 in capacitance touch measurement blocks 202 associated with capacitive touch elements 112 that are located in the identified region. As described above, CPU 120 may increase the gain of the identified capacitive touch measurement blocks 202 by issuing a signal to capacitive measurement circuitry 140 (e.g., to gain stages 306) on control line GN_CTRL, or alternatively by forwarding a gain increase signal over data bus DATA_BUS. Further in the alternative, in some implementations piezoelectric measurement circuitry 150 may itself issue the gain control signal to the capacitive measurement circuitry 140 for the identified region. In any case, this increased gain level applied in process 604 increases the sensitivity of the touch input detection at capacitive touch elements 112 in the identified region, for example to a sensitivity sufficient to detect a touch input by a gloved finger, or by a bare finger in wet (e.g., rainy) conditions or through ice overlaying keypad 100, etc. In this example, nominal gain will continue to be applied by gain stages 306 for those capacitance touch measurement blocks 202 associated with capacitive touch elements 112 that are not located in the identified region. A timer (e.g., timer 130) is also set in process 604.

Following the increasing of gain for the selected gain stages 306 in process 604, sensing of changes in capacitance at capacitive touch elements 112 is then performed in process 606 using the increased gain level in the region of keypad 100 identified in process 602, and using the nominal gain level for elements in other regions of keypad 100. As described above, capacitive measurement circuitry 150 may repeatedly scan capacitive touch measurement blocks 202 in process 606 to interrogate each capacitive touch element 112 (e.g., each numeric key in keypad 100), including both those in the region with enhanced gain and those in other regions of keypad 100. Detected user touch inputs are then forwarded by capacitive measurement circuitry 150 to CPU 120 for processing to carry out the desired operations of microcontroller 110 in response.

Sensing at the increased gain level for the identified region continues for a particular duration. In this regard, decision 607 is performed by CPU 120 to interrogate the timer set in process 604 to determine whether the selected duration of increased gain has elapsed. If not (decision 607 is "no"), process 606 continues with the increased gain at the region identified in process 602.

In this example embodiment, process 606 may be performed according to the approach described above relative to FIG. 5B, in which the increased gain for the identified region of keypad 100 is decreased to the nominal or another lower gain level in response to the amplitude of the capacitive touch input exceeding a threshold (e.g., threshold T_MAX). Alternatively, the increased gain for the identified region of keypad 100 may be used for the entire duration regardless of amplitude.

If the duration of increased gain has elapsed (decision 607 is "yes"), microcontroller 110 resets the gain applied by gain stages 306 in capacitive touch measurement blocks 202 to its nominal or other lower value. Sensing of touch inputs at keypad 100 then continues from process 600 in the manner described above.

According to this alternative example embodiment of FIG. 6, additional efficiency is attained in HMI systems, specifically by limiting the application of increased gain in sensing capacitive touch elements of a keypad or other HMI device to regions receiving greater physical pressure, as sensed by piezoelectric touch elements.

According to another example embodiment, haptic output functionality is provided in the HMI system to provide user feedback and other functions. In this example embodiment, the HMI system includes driver circuitry to actuate the piezoelectric elements in the keypad or other HMI device to provide haptic output. This haptic output can be used to provide positive feedback to the user in response to a user input, and can additionally be used to clear ice, water droplets or other forms of moisture, as well as dirt and debris from the touch elements.

Figure 7:
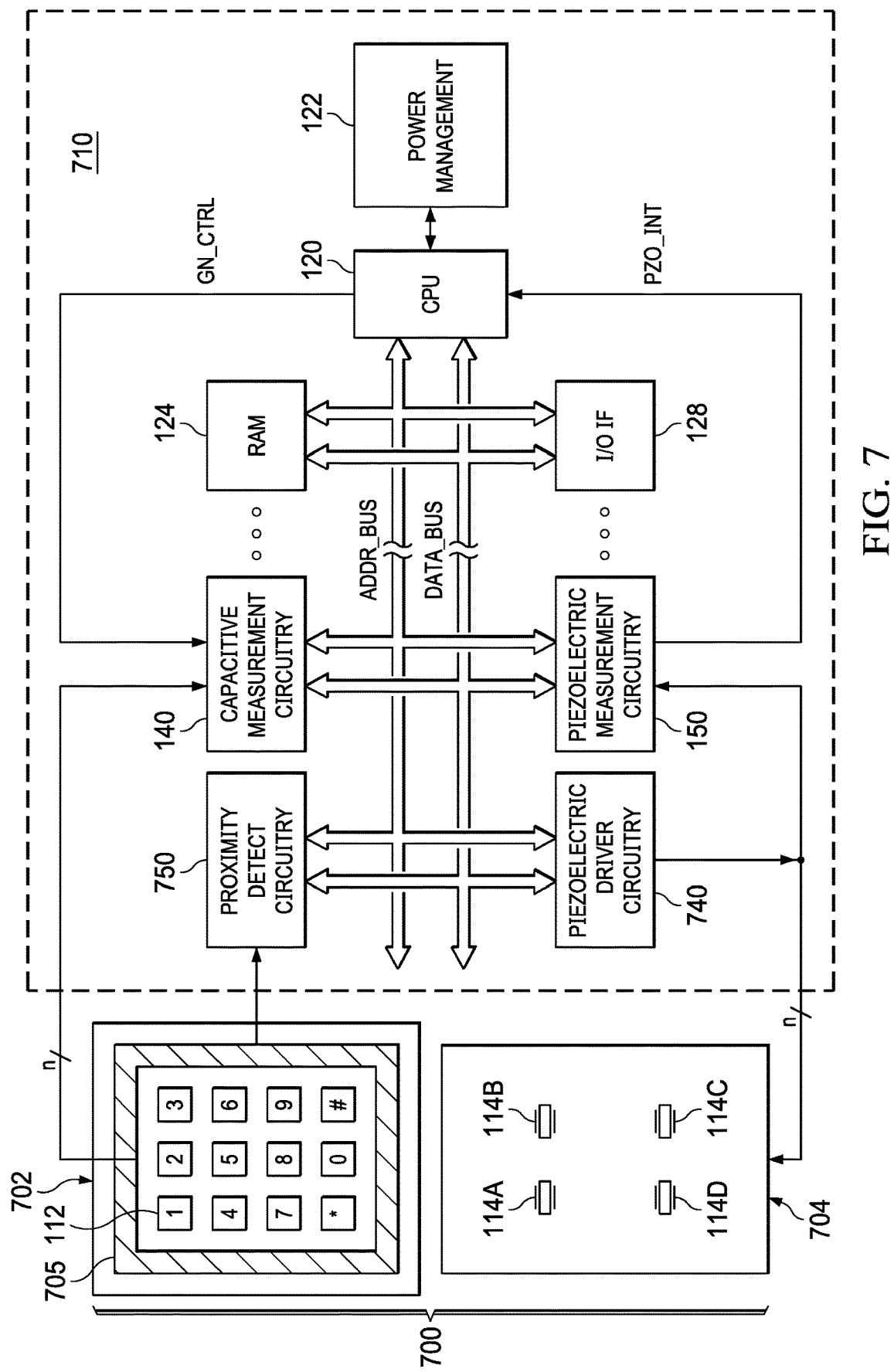
FIG. 7 is an electrical diagram, in block form, of a human machine interface (HMI) system according to another example embodiment.
Figure 8:
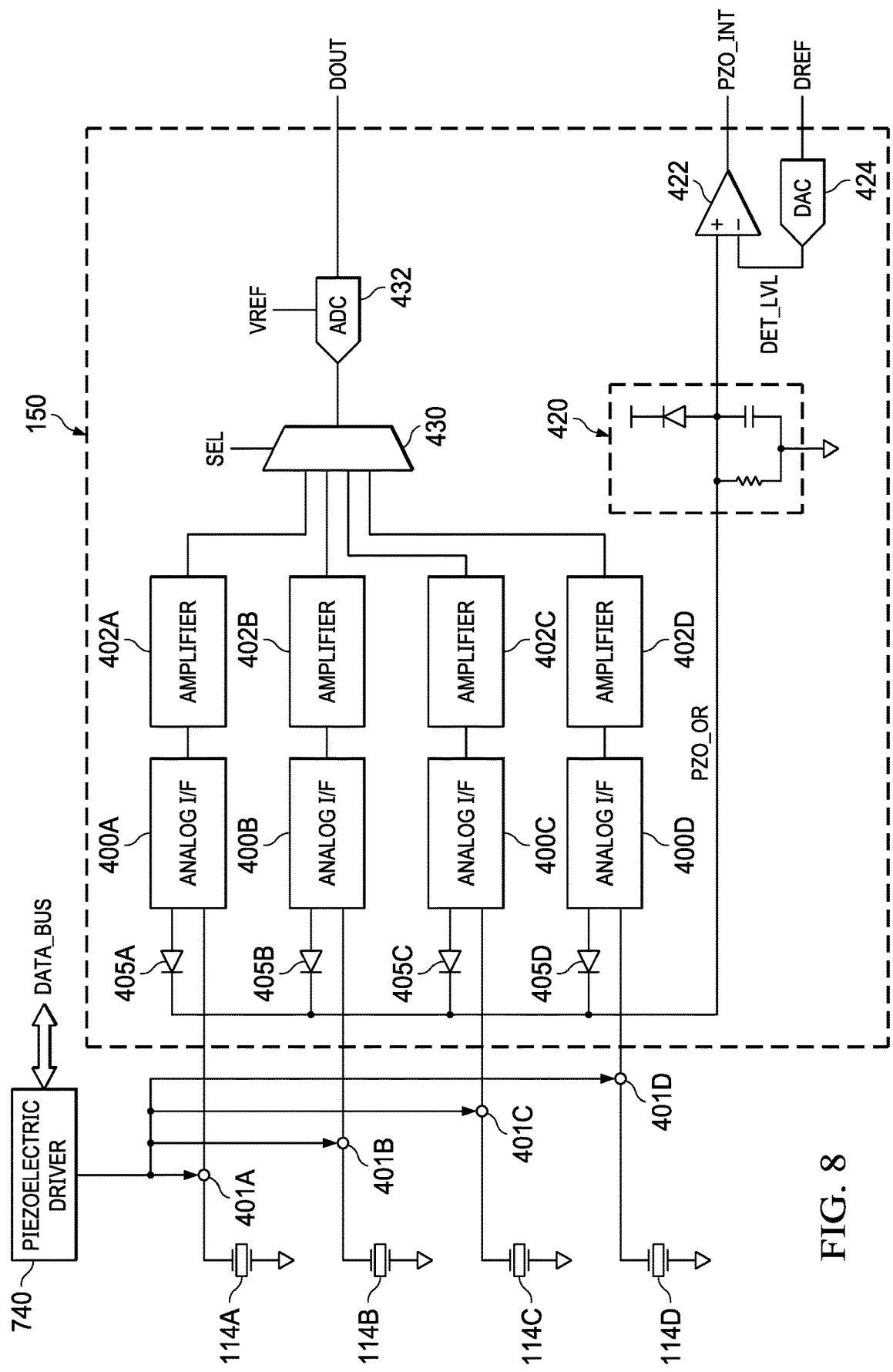
FIG. 8 is an electrical diagram, in block and schematic form, of piezoelectric driver circuitry in combination with a piezoelectric measurement function in the system of FIG. 7 according to an example embodiment.
Figure 9:
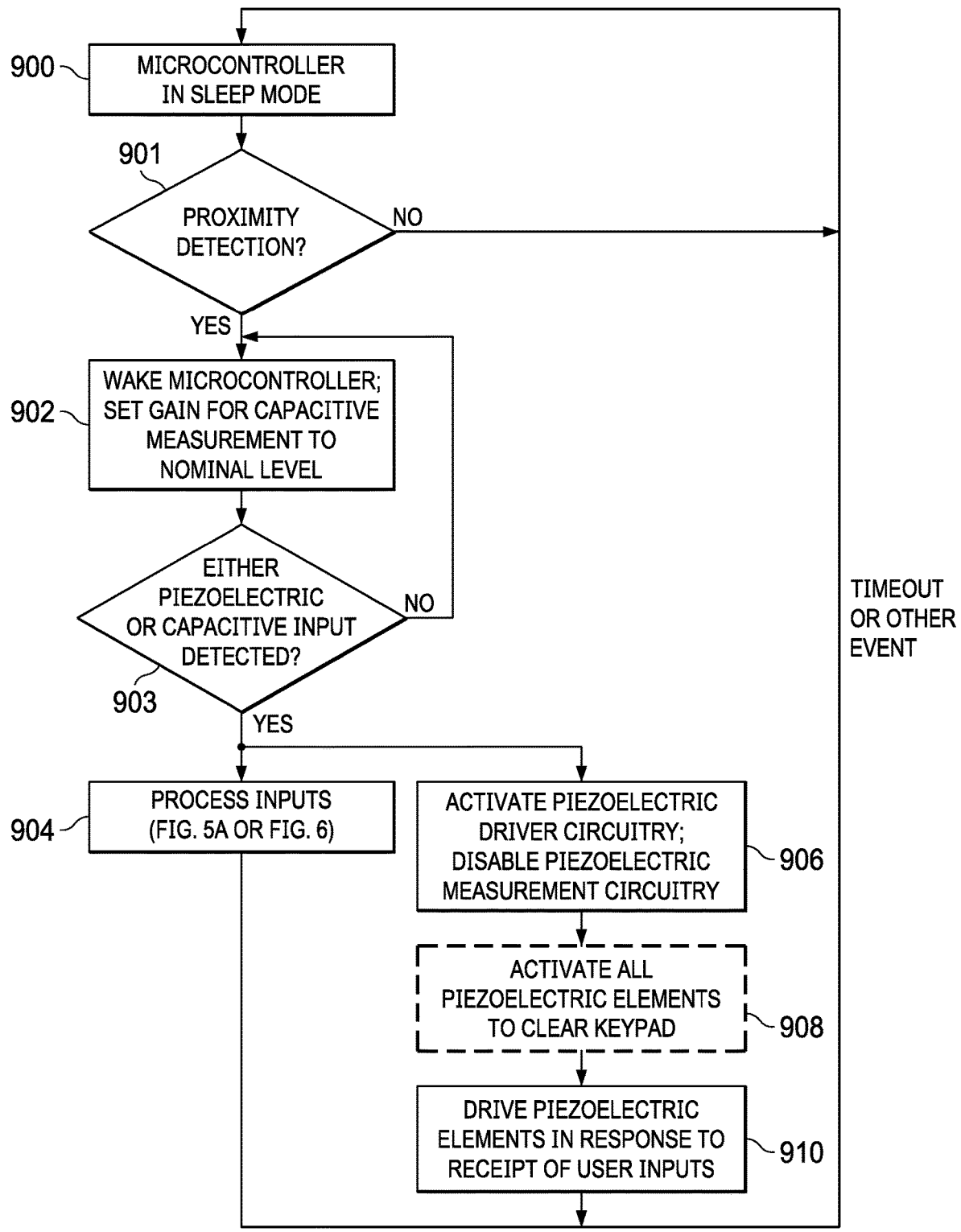
FIG. 9 is a flow diagram of a method of detecting touch inputs and producing haptic output in an HMI system as in FIG. 7 according to an example embodiment.

Referring now to FIGS. 7 through 9, the construction and operation of a touch-sensitive HMI system according to alternative example embodiments will be described. In these FIGS. 7 through 9, the same reference numbers are used for the same or similar (in function and/or structure) features in the previously described examples.

FIG. 7 illustrates the architecture of a touch-sensitive HMI system constructed according to an example embodiment. In this example, keypad 700 includes capacitive array 702, which includes one or more capacitive touch elements 112 as in the example of FIG. 1, arranged in the conventional numeric keypad arrangement. Each capacitive touch element 112 may be constructed as described above, and may be implemented in either of the self capacitance or mutual capacitance measurement modes. Visible indicators may additionally be provided for each of capacitive touch elements 112 to facilitate user actuation. As in the example of FIG. 1, keypad 700 also includes piezoelectric array 704 with four piezoelectric touch elements 114A through 114D, for example as embedded within keypad 700 and not visible or otherwise associated with a visible indicator.

As in the example of FIG. 1, capacitive array 702 and piezoelectric array 704 in the example embodiment of FIG. 7 may overlay one another in keypad 700 so that the same user touch at keypad 700 can be detected by both one or more of capacitive touch elements 112 and one or more of piezoelectric touch elements 114. As noted above, the particular association of the position of piezoelectric touch elements 114 relative to capacitive touch elements 112 in keypad 700 may vary from application to application.

In the system of FIG. 7, capacitive array 702 and piezoelectric array 704 of keypad 700 are coupled to microcontroller 710. Microcontroller 710 in this example embodiment is constructed similarly as microcontroller 110 described above in connection with FIG. 1, with multiple functional circuit modules coupled to CPU 120 via address bus ADDR_BUS and data bus DATA_BUS. Microcontroller 710 in this example embodiment also includes one or more modules in addition to those included in microcontroller 110 as described above, including piezoelectric driver circuitry 740.

According to this example embodiment, piezoelectric driver circuitry 740 has one or more outputs coupled to piezoelectric touch elements 114 in piezoelectric array 104 of keypad 700. As known in the art, conventional piezoelectric elements function both to produce a voltage in response to an applied mechanical pressure and also to produce a mechanical deformation in response to an applied voltage. As described above, piezoelectric measurement circuitry 150 described above receives the voltages produced by piezoelectric touch elements 114 in response to pressure from a user input. Conversely, in this example embodiment, piezoelectric driver circuitry 740 is adapted to provide drive signals to cause a deformation by one or more of piezoelectric touch elements 114, thus producing a haptic output at keypad 700. Piezoelectric driver circuitry 740 may be constructed in the conventional manner, an example of which is the DRV2667 piezoelectric haptic driver available from Texas Instruments Incorporated. In the example embodiment of FIG. 7, piezoelectric driver circuitry 740 operates to provide drive signals to piezoelectric touch elements 114 under the control of CPU 120, for example as communicated to piezoelectric driver circuitry 740 via data bus DATA_BUS or via dedicated control lines (not shown).

Alternatively, piezoelectric driver circuitry 740 may be implemented externally to microcontroller 710. In this alternative implementation, digital or analog control signals may be provided from microcontroller 710 by input/output interface function 128 or another function of microcontroller 710.

Keypad 700 optionally includes, according to this example embodiment, proximity sensor 705 arranged as a rectangular ring encircling the array of capacitive touch elements 112 at keypad 700. Proximity sensor 705 may be realized as a capacitive, inductive, or magnetic element arranged to detect the presence of a user's finger or other actuating element in the proximity of keypad 700.

In this example in which keypad 700 includes optional proximity sensor 705, microcontroller 710 also includes the module of proximity detection circuitry 750. Proximity detection circuitry 750 has an input coupled to receive signals from proximity sensor 705 in keypad 700, and is constructed and operates to process those signals from proximity sensor 705 and communicate signals to CPU 120 (e.g., via data bus DATA_BUS) indicating whether an actuating element such as a user's finger is in the proximity of keypad 700. The particular construction and operation of proximity detection circuitry 750 will depend upon the technology used to implement proximity sensor 705 (e.g., capacitive, inductive, magnetic, etc.).

Referring now to FIG. 8, the implementation of piezoelectric driver circuitry 740 in combination with piezoelectric measurement circuitry 150 according to an example embodiment will be described. As described above in connection with FIG. 4, piezoelectric measurement circuitry 150 has inputs coupled to terminals 401A through 401D, at which piezoelectric touch elements 114A through 114D, respectively, are connected. Each of terminals 401A through 401D is coupled to a corresponding analog interface 400A through 400D. Each analog interface 400 has an output coupled to the anode of a corresponding diode 405, and an output coupled to a corresponding instance of amplifier circuitry 402. The cathodes of diodes 405A through 405D are connected in common to a wired-OR node PZO_OR, which is coupled to an input of comparator 422 as described above.

FIG. 8 shows piezoelectric driver circuitry 740 coupled to data bus DATA_BUS, over which control and data signals may be communicated to and from CPU 120. For purposes of haptic output in this example in which multiple piezoelectric touch elements 114 are implemented in keypad 700 with a twelve-key arrangement of capacitive touch elements 112, it is contemplated that a user would generally be unable to distinguish a haptic output at one piezoelectric touch element 114 from a haptic output at another. As such, in this example, piezoelectric driver circuitry 740 has an output coupled in common to all of terminals 401A through 401D, and thus coupled in common to piezoelectric touch elements 114A through 114D. This results in any output drive signal produced by piezoelectric driver circuitry 740 to be simultaneously applied in common to all of piezoelectric touch elements 114A through 114D to produce the haptic output at keypad 700.

Alternatively, piezoelectric driver circuitry 740 may have multiple outputs, each coupled to a single one of terminals 401A through 401D, in order to drive individual ones of piezoelectric touch elements 114A through 114D in response to data communicated by CPU 120 over data bus DATA_BUS.

FIG. 9 illustrates the generalized operation of the system of FIG. 7 according to one or more example embodiments. In this example, it is contemplated that these operations will be carried out by and under the direction and control of CPU 120 in combination with other functions in microcontroller 710, including piezoelectric driver circuitry 740. For example, CPU 120 may carry out and control these operations by executing program instructions stored in machine-readable form in the memory resources of the system, such as ROM 126 and in some implementations RAM 124. Alternatively or in addition, some or all of the operations described herein may be executed by special-purpose or dedicated logic circuitry.

As described above, the system of FIG. 7 includes proximity sensor 705 and proximity detect circuitry 750, both of which are optional. When these functions are included in the HMI system as in this example embodiment, additional power savings can be attained by enabling microcontroller 710 to be placed in a sleep mode as shown by state 900 of FIG. 9. In this sleep mode, many functions of microcontroller 710 (e.g., CPU 120, capacitive measurement circuitry 140) may be powered down, with proximity detect circuitry 750 remaining powered up to the extent necessary to receive and process signals from proximity sensor 705. In this sleep mode, the polling of capacitive touch elements 114 by capacitive measurement circuitry 140 is paused, avoiding the consumption of the significant power required by that operation. If a user or other actuating element is not in the proximity of keypad 700 (decision 901 is "no"), microcontroller 710 remains in sleep mode in state 900. If a user approaches keypad 700 and is about to make an input at keypad 700 (e.g., the user's finger is in proximity of keypad 700), proximity sensor 705 communicates a corresponding signal to proximity detect circuitry 750 of microcontroller 710. In this event (decision 901 is "yes"), proximity detect circuitry 750 issues the appropriate signals to CPU 120 and other functions of microcontroller 710 to "wake" the device from the sleep state in process 902, placing microcontroller 710 in an active condition and initiating the polling of capacitive touch elements 114 by capacitive measurement circuitry 140.

As CPU 120 and capacitive measurement circuitry 140 are awakened in process 902, a nominal gain level is set at gain stages 306 of capacitive measurement circuitry 140, as described above relative to FIG. 5A (e.g., process 500). Detection of a user input at capacitive touch elements 112, piezoelectric touch elements 114, or both is then enabled. According to this example embodiment, if either or both a piezoelectric or a capacitive touch input is received (decision 903 is "yes"), the corresponding inputs are processed in process 904, in the manner described above in connection with FIG. 5A or FIG. 6. As described above, this operation of the HMI system in which a gain level in capacitive measurement circuitry 140 is increased in response to piezoelectric measurement circuitry 150 detecting significant pressure from the user input, enables improved receipt of user inputs in challenging environmental conditions while reducing vulnerability of the HMI system to increased noise, thermal drift, and excess power consumption as could result from excessively high gain.

In addition to the enabling of these benefits, this example embodiment also provides haptic output in response to the receipt of the input in decision 903. In this example embodiment, piezoelectric driver circuitry 740 is enabled to drive signals at terminals 401A through 401D in process 906. If desired, piezoelectric measurement circuitry 150 may be disabled from receiving inputs from terminals 401A through 401D at this time, to avoid responding to voltages driven by piezoelectric driver circuitry 740 at terminals 401A through 401D. Alternatively, piezoelectric measurement circuitry 150 and piezoelectric driver circuitry 740 may be operated in a "half-duplex" fashion to avoid interference between the signals driven and received at piezoelectric touch elements 114A through 114D.

Once piezoelectric driver circuitry 740 is enabled in process 906, process 908 may optionally be performed to clear ice, water and moisture, or dirt and debris from the surface of keypad 700. Process 906 in this example may be performed by piezoelectric driver circuitry 740 driving voltages at terminals 401A through 401D, for example at a selected amplitude and at sonic or ultrasonic frequencies for a selected duration, to cause vibrations at keypad 700 for clearing foreign substances from its surface. Alternatively, process 908 may be performed unconditionally as microcontroller 710 wakes from the sleep state in process 902, to prepare keypad 700 for receiving user inputs.

In process 910, after piezoelectric driver circuitry 740 is activated in process 906, CPU 120 communicates signals over data bus DATA_BUS to piezoelectric driver circuitry 740 in response to user inputs received and processed in process 904. The signals communicated by CPU 120 in process 910 in this example embodiment cause piezoelectric driver circuitry 740 to drive voltages at one or more of terminals 401A through 401D in response to the receipt by CPU 120 of the touch inputs at keypad 700, to provide haptic feedback to the user. This haptic feedback provides the user with positive confirmation of the receipt of each user input, improving the user experience with the HMI system. System operation continues with processes 904, 910 during such time as user inputs are received, until a timeout or other events places the system back into sleep mode 900.

In addition to the advantages enabled by the example embodiment of FIGS. 1 through 6, this example embodiment further enables other technical advantages. Haptic feedback to the user in response to user inputs provides an improved user experience, especially in challenging conditions in which the user may not be confident that the HMI system is sensing a touch input. Examples of such challenging conditions include cold weather, in which the user may be wearing gloves, and wet or icy conditions, in which the user may be unsure whether his input is sensed. And as described above, the HMI system according to this example embodiment enables the driving of piezoelectric elements to clear ice, water, and other debris from the surface of the keypad, further increasing the reliability of detection and processing of user inputs. The inclusion of the optional proximity sensor at the keypad of the HMI system according to this example embodiment can provide additional power consumption savings, as the microcontroller can be largely powered down, and the power-intensive polling of capacitive touch elements paused, until such time as the proximity sensor detects a user in the proximity of the keypad. Overall system power consumption over system life can thus also be significantly reduced.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. An apparatus, comprising:
   capacitive measurement circuitry, coupled to one or more capacitor input terminals, and comprising a gain stage configured to amplify a signal to generate an amplified signal corresponding to a capacitance at the one or more capacitor input terminals by a gain level;
   piezoelectric measurement circuitry coupled to one or more piezoelectric terminals;
   gain control circuitry coupled to the piezoelectric measurement circuitry and the capacitive measurement circuitry, and configured to:
      increase the gain level of the gain stage from a first level to a second level for a selected duration responsive to the piezoelectric measurement circuitry receiving an input signal representing a user input from at least one of the one or more piezoelectric terminals to cause the gain stage to generate the amplified signal with the second level,
      after increasing the gain level of the gain stage to the second level, in response to the amplified signal being higher than a predetermined threshold, lower the gain level of the gain stage from the second level;
      after the selected duration, set the gain level at the gain stage to a lower level that is lower than the second level to cause the gain stage to generate the amplified signal with the lower level; and
   processing circuitry, coupled to the capacitive measurement circuitry, and configured to process user inputs corresponding to the amplified signal communicated from the capacitive measurement circuitry.

2. The apparatus of claim 1, wherein the piezoelectric measurement circuitry comprises:
   an analog interface circuit configured to communicate an input signal received at a piezoelectric terminal to an output as a voltage;
   and wherein the gain control circuitry comprises:
      a comparator having a first input coupled to the output of the analog interface circuit, and a second input coupled to receive a reference level, for generating at an output a signal indicating that a voltage at the output of the analog interface circuit exceeds the reference level.

3. The apparatus of claim 2, wherein the signal generated at the output of the comparator corresponds to an interrupt request to the processing circuitry;
   wherein the processing circuitry is configured to communicate a gain control signal to the capacitive measurement circuitry responsive to receiving the interrupt request from the comparator;
   and wherein the gain stage of the capacitive measurement circuitry increases the gain level of the gain stage responsive to the gain control signal.

4. The apparatus of claim 1, further comprising:
   piezoelectric driver circuitry coupled to the one or more piezoelectric terminals, and configured to drive a voltage at the one or more piezoelectric terminals responsive to the processing circuitry processing a user input.

5. The apparatus of claim 4, further comprising:
   proximity detection circuitry coupled to a proximity sensor input and configured to detect signals at the proximity sensor input;
   wherein the processing circuitry is configured to awaken from a sleep state responsive to the proximity detection circuitry detecting signals at the proximity sensor input corresponding to a proximity sensing.

6. An apparatus, comprising:
   capacitive measurement circuitry, coupled to one or more capacitor input terminals, and comprising a gain stage configured to amplify a signal to generate an amplified signal corresponding to a capacitance at the one or more capacitor input terminals by a gain level;
   piezoelectric measurement circuitry coupled to a plurality of piezoelectric terminals;
   gain control circuitry coupled to the piezoelectric measurement circuitry and the capacitive measurement circuitry, and configured to increase the gain level of the gain stage responsive to the piezoelectric measurement circuitry receiving an input signal representing a user input from at least one of the plurality of piezoelectric terminals; and
   processing circuitry, coupled to the capacitive measurement circuitry, and configured to process user inputs corresponding to the amplified signal communicated from the capacitive measurement circuitry, wherein:
      the piezoelectric measurement circuitry comprises an analog interface circuit configured to communicate an input signal received at a piezoelectric terminal to an output as a voltage;
      the gain control circuitry comprises a comparator having a first input coupled to the output of the analog interface circuit, and a second input coupled to receive a reference level, for generating at an output a signal indicating that a voltage at the output of the analog interface circuit exceeds the reference level;
      the signal generated at the output of the comparator corresponds to an interrupt request to the processing circuitry;
      the processing circuitry is configured to communicate a gain control signal to the capacitive measurement circuitry responsive to receiving the interrupt request from the comparator;
      the gain stage of the capacitive measurement circuitry increases the gain level of the gain stage responsive to the gain control signal;
      the piezoelectric measurement circuitry comprises a plurality of analog interface circuits, each coupled to one of the plurality of piezoelectric terminals and each having an output;
      the first input of the comparator is coupled to the output of each of the plurality of analog interface circuits; and
      the comparator is configured to generate the interrupt request responsive to a voltage at one or more of the outputs of the plurality of analog interface circuits exceeding the reference level.

7. The apparatus of claim 6, wherein the piezoelectric measurement circuitry further comprises:
- a plurality of amplifiers, each having an input coupled to an output of a corresponding analog interface circuit, and having an output;
- a multiplexer, having a plurality of inputs, each coupled to an output of one of the plurality of amplifiers, and having a select input coupled to receive a select signal; and
- an analog-to-converter having an input coupled to an output of the multiplexer, and having an output coupled to the gain control circuitry.

8. The apparatus of claim 7, wherein the capacitive measurement circuitry is coupled to a plurality of capacitor input terminals, and comprises:
- a plurality of capacitive touch measurement circuits, each comprising a gain stage configured to amplify a signal corresponding to a capacitance at the one or more capacitor input terminals by a gain level;
- wherein the processing circuitry is configured to determine, from measurements obtained from each of the plurality of amplifiers of the piezoelectric measurement circuitry responsive to receiving the interrupt request, one of the plurality of piezoelectric terminals receiving a highest voltage, and to increase the gain level of one or more of the gain stages of the plurality of capacitive touch measurement circuits selected according to the determined one of the plurality of piezoelectric terminals receiving the highest voltage.

9. A method of detecting user inputs at a human machine interface (HMI), comprising the steps of:
- setting a gain level in at least one gain stage in capacitive measurement circuitry coupled to a plurality of capacitive touch elements of the HMI to a first gain level;
- detecting whether one or more piezoelectric touch elements of the HMI is receiving user touch pressure;
- at the capacitive measurement circuitry, responsive to detecting that none of the one or more piezoelectric touch elements of the HMI is receiving user touch pressure, generating measurement signals corresponding to capacitance one or more of the plurality of capacitive touch elements of the HMI using the first gain level;
- responsive to detecting that one or more piezoelectric touch elements of the HMI is receiving user touch pressure:
  - setting the gain level in at least one gain stage in the capacitive measurement circuitry to a second gain level greater than the first gain level; and
  - then generating measurement signals corresponding to capacitance at one or more of the plurality of capacitive touch elements of the HMI using the second gain level; and
- at a processor,
  - receiving measurement signals from the capacitive measurement circuitry generated using the second gain level,
  - comparing a first amplitude of the measurement signals with a maximum threshold level,
  - responsive to the first amplitude exceeding the maximum threshold level, setting the gain level in the at least one gain stage in the capacitive measurement circuitry to a gain level lower than the second gain level and generating measurement signals corresponding to capacitance at one or more of the plurality of capacitive touch elements of the HMI using the lower gain level, and
  - detecting a touch event at one or more of the plurality of capacitive touch elements from the received measurement signals, wherein the step of generating measurement signals using the second gain level is performed for a selected duration, the method further comprising:
    - after the selected duration, setting the gain level in the at least one gain stage in the capacitive measurement circuitry to a lower gain level that is lower than the second gain level; and
    - then generating measurement signals corresponding to capacitance at one or more of the plurality of capacitive touch elements of the HMI using the lower gain level.

10. The method of claim 9, wherein the lower gain level is the first gain level.

11. The method of claim 9, further comprising:
applying a drive signal to one or more piezoelectric touch elements responsive to the receiving of measurement signals from the capacitive measurement circuitry indicating one or more of the plurality of capacitive touch elements receiving capacitance changes.

12. The method of claim 11, further comprising:
placing the processor in a sleep state;
then detecting whether a proximity sensor of the HMI is sensing a user in proximity of the HMI; and
responsive to detecting that the proximity sensor of the HMI is sensing a user in proximity of the HMI, awakening the processor from the sleep state.

13. A method of detecting user inputs at a human machine interface (HMI) that comprises a plurality of piezoelectric touch elements, the method comprising:
- setting a gain level in at least one gain stage in capacitive measurement circuitry coupled to a plurality of capacitive touch elements of the HMI to a first gain level;
- detecting whether one or more piezoelectric touch elements of the HMI is receiving user touch pressure;
- at the capacitive measurement circuitry, responsive to detecting that none of the one or more piezoelectric touch elements of the HMI is receiving user touch pressure, generating measurement signals corresponding to capacitance one or more of the plurality of capacitive touch elements of the HMI using the first gain level;
- responsive to detecting that one or more piezoelectric touch elements of the HMI is receiving user touch pressure:
  - determining which one of the piezoelectric touch elements is receiving user touch pressure;
  - setting the gain level for at least one gain stage corresponding to one or more capacitive touch elements in a region of the HMI near the one of the piezoelectric touch elements receiving user touch pressure to a second gain level greater than the first gain level; and
  - generating measurement signals corresponding to capacitance at one or more of the plurality of capacitive touch elements of the HMI using the second gain level; and
- at a processor, receiving measurement signals from the capacitive measurement circuitry and detecting a touch event at one or more of the plurality of capacitive touch elements from the received measurement signals.

14. A human machine interface (HMI) system, comprising:
an HMI comprising at least one piezoelectric touch element and a plurality of capacitive touch elements;

a microcontroller coupled to the HMI, and comprising:
capacitive measurement circuitry, coupled to the plurality of capacitive touch elements, and comprising a gain stage configured to amplify a signal to generate an amplified signal corresponding to a capacitance at the capacitive touch elements by a gain level;
piezoelectric measurement circuitry, coupled to the at least one piezoelectric touch element;
gain control circuitry coupled to the piezoelectric measurement circuitry and the capacitive measurement circuitry, and configured to:
increase the gain level of the gain stage from a first level to a second level for a selected duration responsive to the piezoelectric measurement circuitry receiving an input signal representing a user input from at least one of the piezoelectric touch elements to cause the gain stage to generate the amplified signal with the second level, and
after increasing the gain level of the gain stage to the second level, in response to the amplified signal being higher than a predetermined threshold, lower the gain level of the gain stage from the second level;
after the selected duration, set the gain level at the gain stage to a lower level that is lower than the second level to cause the gain stage to generate the amplified signal with the lower level; and
processing circuitry, coupled to receive amplified signals from the capacitive measurement circuitry for processing as user inputs.

15. The system of claim 14, wherein the piezoelectric measurement circuitry comprises:
an analog interface circuit configured to communicate an input signal received at the at least one piezoelectric touch element to an output as a voltage;
and wherein the gain control circuitry comprises:
a comparator, coupled to the analog interface circuit, having a first input coupled to the output of the analog interface circuit to receive the voltage, having a second input coupled to receive a reference level, and having an output presenting an interrupt request responsive to the voltage at the output of the analog interface circuit exceeding the reference level; and
circuitry for communicating to the gain stage, responsive to the interrupt request, a gain control signal indicating the increase of the gain level.

16. The system of claim 15, wherein a central processing unit comprises the processing circuitry and the circuitry for communicating the gain control signal.

17. The system of claim 14, further comprising:
piezoelectric driver circuitry coupled to the at least one piezoelectric touch element and configured to drive a voltage at the at least one piezoelectric touch element responsive to the processing circuitry processing a user input.

18. The system of claim 14, wherein the HMI further comprises:
a proximity sensor;
wherein the microcontroller further comprises:
proximity detection circuitry configured to detect signals from the proximity sensor;
and wherein the processing circuitry is configured to awaken from a sleep state responsive to the proximity detection circuitry detecting signals from the proximity sensor indicating sensing of a user in proximity of the HMI.

19. The system of claim 14, further comprising a plurality of piezoelectric touch elements, wherein a number of piezoelectric touch elements is lower than a number of the plurality of capacitive touch elements.

20. The system of claim 19, further comprising a plurality of piezoelectric touch elements respectively embedded in keys of a keypad, wherein each key of the keypad comprises a respective capacitive touch element of the plurality of capacitive touch elements.

21. The system of claim 14, further comprising a plurality of piezoelectric touch elements, wherein a location of the plurality of piezoelectric touch elements does not coincide with a location of the plurality of capacitive touch elements.

* * * * *